United States Patent
Wang et al.

(10) Patent No.: US 11,581,383 B2
(45) Date of Patent: Feb. 14, 2023

(54) ARRAY SUBSTRATE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Li Wang, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 191 days.

(21) Appl. No.: 17/044,182

(22) PCT Filed: Apr. 10, 2020

(86) PCT No.: PCT/CN2020/084177
§ 371 (c)(1),
(2) Date: Sep. 30, 2020

(87) PCT Pub. No.: WO2020/207466
PCT Pub. Date: Oct. 15, 2020

(65) Prior Publication Data
US 2021/0159299 A1    May 27, 2021

(30) Foreign Application Priority Data
Apr. 10, 2019   (CN) .......................... 201910285721.4

(51) Int. Cl.
*H01L 27/32*     (2006.01)
*G09G 3/32*     (2016.01)

(52) U.S. Cl.
CPC .......... *H01L 27/3272* (2013.01); *G09G 3/32* (2013.01); *H01L 27/3276* (2013.01);
(Continued)

(58) Field of Classification Search
CPC .. H01L 27/3272; H01L 27/32; H01L 27/3276
See application file for complete search history.

(56) References Cited

U.S. PATENT DOCUMENTS

| 10,263,056 | B2 * | 4/2019 | Chen ..................... G09G 3/3291 |
| 11,036,958 | B2 * | 6/2021 | Sun ...................... H01L 27/3272 |

(Continued)

FOREIGN PATENT DOCUMENTS

| CN | 103489824 A | 1/2014 |
| CN | 105139806 A | 12/2015 |

(Continued)

OTHER PUBLICATIONS

China Patent Office, CN201910285721.4 First Office Action dated Mar. 30, 2021 and the English translation thereof.

(Continued)

*Primary Examiner* — Sardis F Azongha
(74) *Attorney, Agent, or Firm* — Houtteman Law LLC

(57) ABSTRACT

The present disclosure provides an array substrate and a manufacturing method thereof, a display panel and a display device. The array substrate according to an embodiment of the present disclosure includes: a base substrate, and a plurality of pixel units located on the base substrate; each pixel unit at least includes a driving transistor and a light-emitting device; the array substrate further includes: a shielding layer located between a layer where a gate of a driving transistor in each of the pixel units is located and a layer where a first electrode of the light-emitting device is located.

26 Claims, 8 Drawing Sheets

(52) U.S. Cl.
CPC ............... *G09G 2310/0275* (2013.01); *G09G 2310/0286* (2013.01); *H01L 2227/323* (2013.01)

(56) References Cited

U.S. PATENT DOCUMENTS

2016/0284785 A1* 9/2016 Matsuura ............ H01L 51/5228
2017/0317156 A1   11/2017 Kim et al.

FOREIGN PATENT DOCUMENTS

| CN | 106952940 A | 7/2017 |
| CN | 107369690 A | 11/2017 |
| CN | 107369700 A | 11/2017 |
| CN | 108010944 A | 5/2018 |
| CN | 108305888 A | 7/2018 |
| CN | 109887985 A | 6/2019 |

OTHER PUBLICATIONS

China Patent Office, First Office Action dated Aug. 25, 2020 regarding CN201910285721.4 and the English translation thereof.
China Patnet Office, Second Office Action dated Jan. 28, 2021 regarding CN201910285721.4 and the English translation thereof.
China Patent Office, CN201910285721.4 Third Office Action dated Mar. 30, 2021 and the English translation thereof.

* cited by examiner

ARRAY SUBSTRATE AND MANUFACTURING METHOD THEREOF, DISPLAY PANEL AND DISPLAY DEVICE

CROSS REFERENCE TO RELATED APPLICATION

The present application is a U.S. National Stage Application under 35 U.S.C. § 371 of International Patent Application PCT/CN2020/084177, filed on Apr. 10, 2020, which claims priority to China Patent Application No. 201910285721.4, filed on Apr. 10, 2019, the disclosure of both which are incorporated by reference herein in entirety.

TECHNICAL FIELD

The disclosure relates to the field of display technology, in particular to an array substrate and a manufacturing method thereof, a display panel and a display device.

BACKGROUND

Organic Light-emitting Diode (OLED) display panels have advantages of low energy consumption, low production cost, self-luminescence, wide viewing angle, and fast response speed, and are already applied to the display fields of mobile phones, tablet computers, digital cameras, and the like. In general, the OLED display panel adopts a pixel driving circuit to drive an OLED to emit light for display.

SUMMARY

An embodiment of the present disclosure provides an array substrate including: a base substrate, and a plurality of pixel units on the base substrate; each of the pixel units at least includes a driving transistor and a light-emitting device; the array substrate further includes: a shielding layer located between a layer where a gate of the driving transistor in each pixel is located and a layer where a first electrode of the light-emitting device is located.

In some implementations, an orthographic projection of the gate of each of at least a portion of driving transistors on the base substrate and an orthographic projection of the first electrode of the light-emitting device corresponding thereto on the base substrate at least partially overlap; and the shielding layer is disposed at least between overlapping areas of the gate of the driving transistor and the first electrode of the light-emitting device.

In some implementations, the shielding layer includes a planar structure, and an orthographic projection of the shielding layer on the base substrate covers orthographic projections of the gate of the driving transistor and the first electrode of the light-emitting device on the base substrate.

In some implementations, the shielding layer includes a plurality of shielding electrodes; the plurality of shielding electrodes are in one-to-one correspondence with gates of driving transistors in the pixel units.

In some implementations, the shielding layer includes a plurality of shielding electrodes; the plurality of shielding electrodes are in one-to-one correspondence with first electrodes of light-emitting devices in the pixel units.

In some implementations, the shielding electrode includes a conductive material, and the array substrate further includes a power supply voltage terminal, the shielding electrode is coupled to the power supply voltage terminal.

In some implementations, the shielding layer is located on a side of a layer where a source and a drain of the driving transistor are located away from the base substrate.

In some implementations, the conductive material includes a metal.

In some implementations, the array substrate further includes a driving control circuit on the base substrate, elements in the driving control circuit are located in an area where the pixel units are located.

An embodiment of the present disclosure provides a display panel, which includes the array substrate described above.

An embodiment of the present disclosure provides a display device, which includes the display panel described above.

An embodiment of the present disclosure provides a manufacturing method of the array substrate described above, the manufacturing method including: providing a base substrate; forming a plurality of pixel units on the base substrate; forming a shielding layer between a layer where a gate of a driving transistor in each pixel unit is located and a layer where a first electrode of a light-emitting device is located.

DESCRIPTION OF EMBODIMENTS

In order that those skilled in the art will better understand the technical solutions of the present disclosure, the present disclosure is described in detail below with reference to the accompanying drawings and the specific embodiments.

In a display panel in the related art, a pixel driving part (generally including a driving transistor, a switching transistor, and a storage capacitor) and a light-emitting device (OLED device) in each pixel unit are separately provided, and sizes of the pixel driving part and the light-emitting device are also different.

Figure 1:
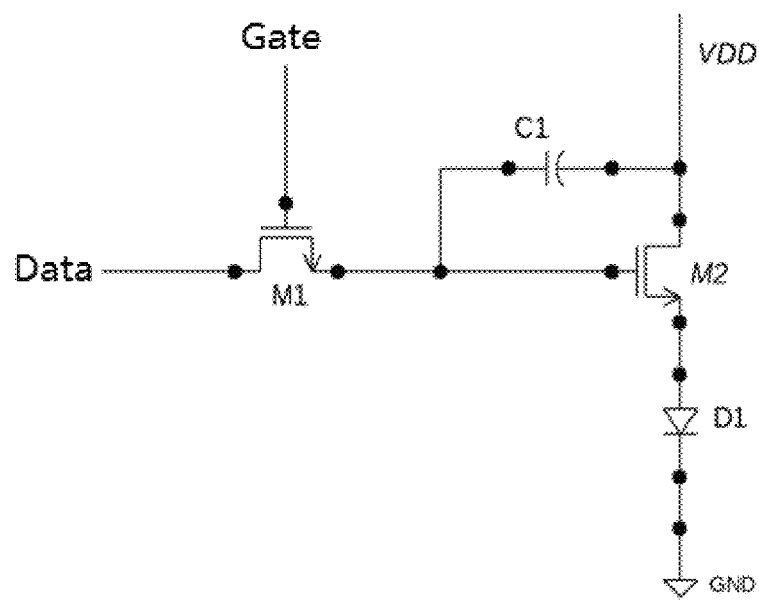
FIG. 1 is a schematic structural diagram of a pixel circuit in the related art.

In order to make the technical solutions provided by the embodiments of the present disclosure clearer, basic structures on an array substrate are briefly described. Generally, the array substrate includes a base substrate, a plurality of gate lines and a plurality of data lines are arranged on the base substrate, the gate lines and the data lines intersect to define a plurality of pixel units which are arranged in an array; each pixel unit is provided with a pixel circuit; as shown in FIG. 1, there is provided a most basic pixel circuit structure, the pixel circuit includes: a switching transistor M1, a driving transistor M2, a storage capacitor C1, a light-emitting device (OLED device) D1; a gate 1 of the switching transistor M1 is coupled to a scan line (i.e., the gate line), a source of the switching transistor M1 is coupled to a data line, and a drain of the switching transistor M1 is coupled to a first terminal of the storage capacitor C1 and a gate 1 of the driving transistor M2; a source of the driving transistor M2 is coupled to a second terminal of the storage capacitor C1 and a power supply voltage terminal VDD, a drain of the driving transistor M2 is coupled to a first electrode (anode 2) of the light-emitting device D1, and a second electrode (cathode) of the light-emitting device D1 is grounded.

Figure 2:
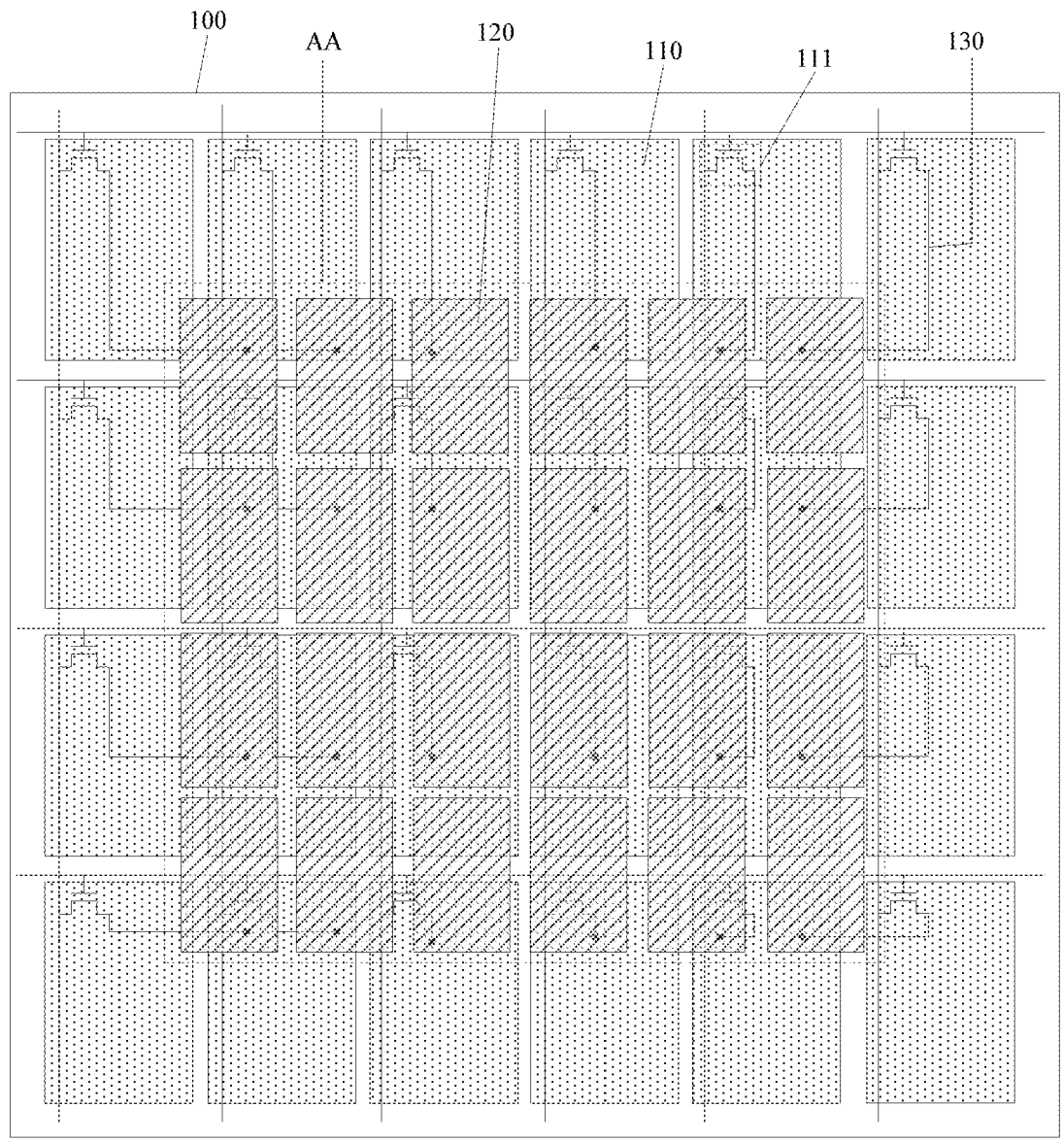
FIG. 2 is a schematic diagram of an organic light-emitting display panel in the related art.
Figure 3:
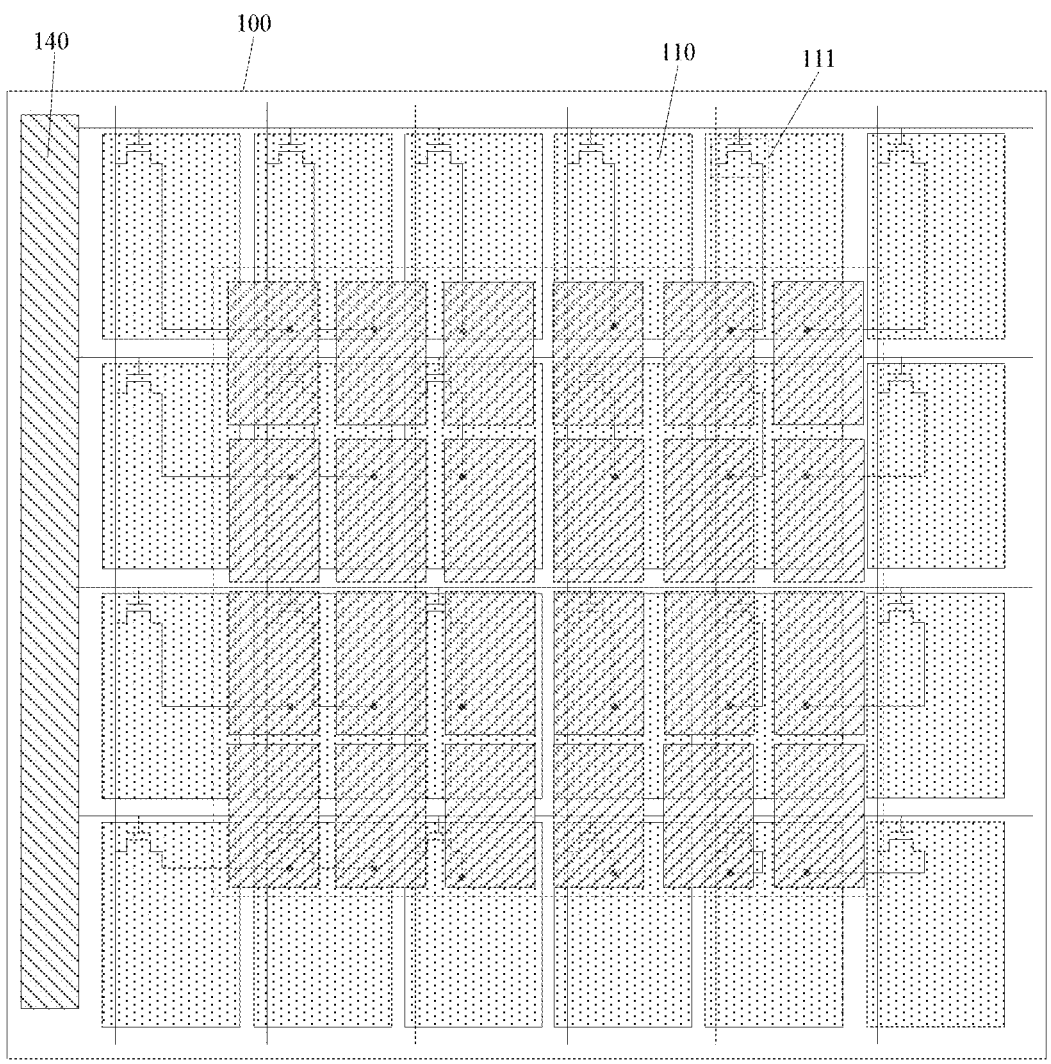
FIG. 3 is a schematic diagram of an organic light-emitting display panel in the related art.
Figure 4:
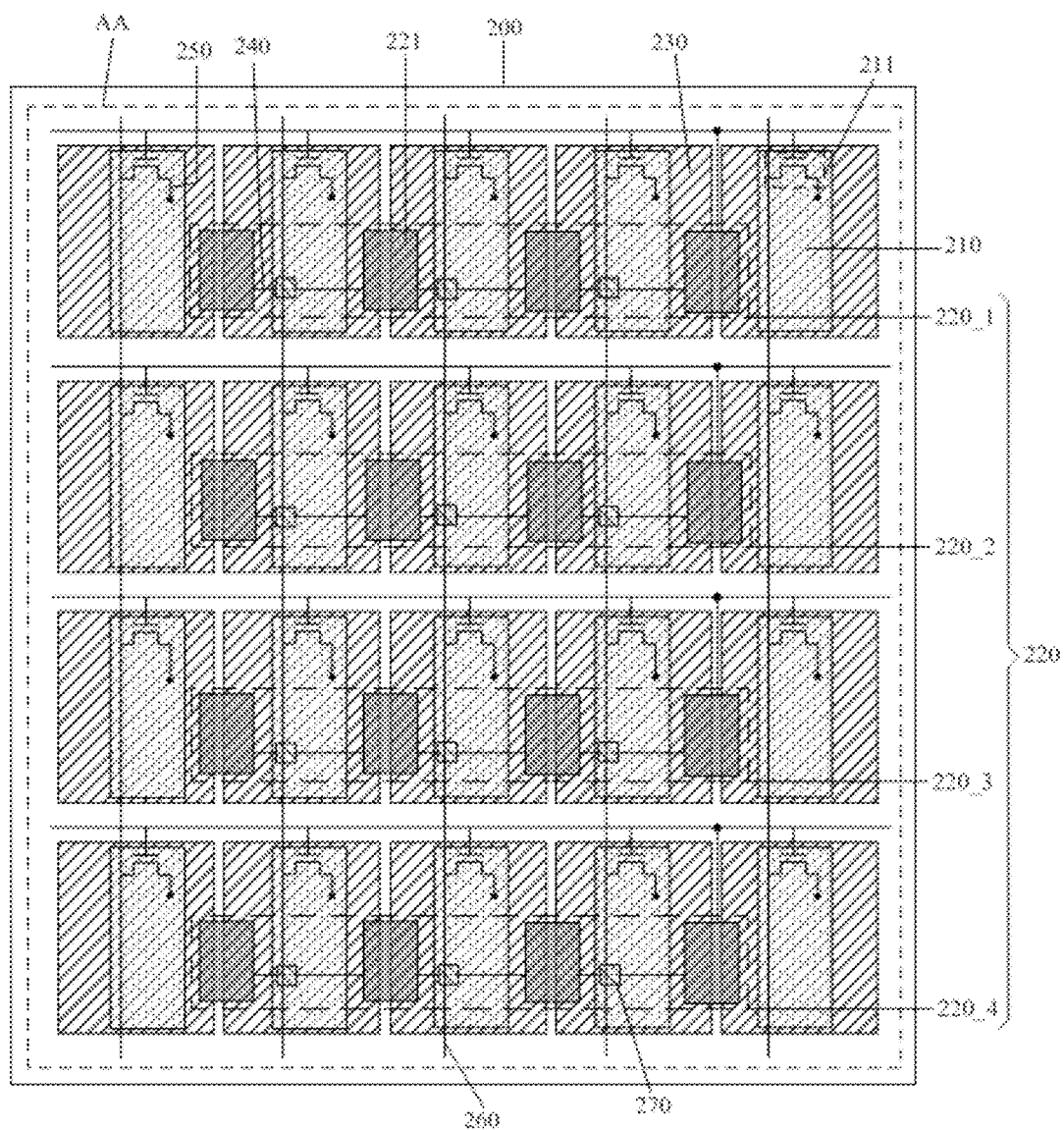
FIG. 4 is a schematic diagram of an organic light-emitting display panel in the related art.

In order to achieve a narrow bezel of the display panel, a driving control circuit is disposed in the pixel unit of the array substrate in the related art, for example, for the organic light-emitting display panel as shown in FIGS. 2 to 4. As shown in FIG. 2, the organic light-emitting display panel may include: a base substrate 100, a plurality of pixel driving circuits 110 located at a side of the base substrate 100, and top-emission type light-emitting devices 120 (i.e., the aforementioned light-emitting devices D1) located in a display area AA of the base substrate 100 and in one-to-one correspondence with the respective pixel driving circuits 110; the top-emission type light-emitting devices 120 are located on a side of the pixel driving circuits 110 away from the base substrate 100; an area of a region where each top-emission type light-emitting device 120 is located is smaller than an area of a region where the pixel driving circuit 110 corresponding thereto is located. Moreover, each top-emission type light-emitting device 120 may include: an anode 121, a light-emitting layer 122, and a cathode 123 stacked in sequence; where the anode 121 of each top-emission type light-emitting device 120 is electrically coupled to the pixel driving circuit 110 corresponding thereto through a first connection line 130. In the organic light-emitting display panel, gate lines may be further included. The pixel driving circuit is configured to drive the top-emission type light-emitting device 120 to emit light. The driving control circuit may include a gate driving circuit to supply a gate scan signal to a scan control transistor through the gate line in the organic light-emitting display panel.

For the organic light-emitting display panel shown in FIG. 2, the area of the region where each of the top-emission type light-emitting devices in one-to-one correspondence with the pixel driving circuits is located is smaller than the area of the region where the pixel driving circuit corresponding thereto is located, and thus an area of layout space of each top-emission type light-emitting device can be reduced without changing an area of an original layout space of each pixel driving circuit, thereby increasing the number of the top-emission type light-emitting devices per inch, further increasing a PPI of the organic light-emitting display panel, and facilitating an implementation of high-resolution of the organic light-emitting display panel. Furthermore, since the area of the region where each top-emission type light-emitting device is located is reduced, there may be a case where there is no direct overlapping area of each top-emission type light-emitting device and the pixel driving circuit corresponding thereto, i.e., a case where, for example, the top-emission type light-emitting device 120 in a sixth column (that is, the rightmost column) in FIG. 2 only overlap with the pixel driving circuit 110 in a fifth column, that is, overlapping areas exit between the top-emission type light-emitting device 120 in the sixth column and the pixel driving circuit in the fifth column, and a misalignment is formed. Accordingly, the anode of each top-emission type light-emitting device 120 may be electrically coupled to the pixel driving circuit 110 corresponding thereto through the first connection line 130 for driving display. Further, an influence of the pixel driving circuit on light emission can be avoided due to an adoption of the top-emission type light-emitting device.

As shown in FIG. 3, the organic light-emitting display panel may further include: a driving control circuit 140 located in a non-display area of the base substrate; in addition, there is no overlapping area between an orthographic projection of a region where all the pixel driving circuits 110 are located on the base substrate 100 and an orthographic projection of the driving control circuit 140 on the base substrate 100. In the related art, the organic light-emitting display panel as shown in FIG. 3 may employ either one-side driving mode or two-side driving mode. The driving control circuit may include a light-emitting control circuit for supplying a light-emitting control signal to the light-emitting control transistor through a light-emitting control signal line in the organic light-emitting display panel.

The organic light-emitting display panel shown in FIG. 3 may have four sides such that the organic light-emitting display panel has a rectangular shape, and the display area may be located at one side of the organic light-emitting display panel. In the related art, the display area may also have four sides, and the sides of the display area may be in one-to-one correspondence with the sides of the organic light-emitting display panel, and corresponding sides of the display area and the organic light-emitting display panel are parallel to each other.

The organic light-emitting display panel as shown in FIG. 4 may include: a base substrate 200, a plurality of pixel driving circuits 210 and a plurality of driving control circuits 220 located in the display area AA of the base substrate 200, and a plurality of top-emission type light-emitting devices 230 located in the display area AA of the base substrate 200 and covering the pixel driving circuits 210 and the driving control circuits 220. The driving control circuit 220 may include: a plurality of shift register units 220_m (m=1, 2, 3 . . . M; where M is a total number of shift register units included in the driving control circuit; FIG. 4 takes M=4 as an example) which are cascaded; each of the shift register units 220_m is divided into a plurality of sub-units 221, and each sub-unit 221 is located in a gap between two adjacent pixel driving circuits; the sub-units 221 in a same one of the shift register unit 220_m are located at different gaps respectively, and the sub-units 221 in the same one of the shift register unit 220_m are electrically coupled to each other through a second connection line 240. As shown in FIG. 4, the organic light-emitting display panel may further include: a metal shielding layer 270 between a layer where the second connection line 240 is located and a layer where a data line 260 is located; an orthographic projection of the metal shielding layer 270 on the base substrate 200 covers orthographic projections of overlapping areas between a power supply line, the data line 260 and the second connection line 240 on the base substrate 200. In addition, in practical applications, the metal shielding layer 270 is further electrically coupled to the power supply line through a via hole, so as to implement a function of shielding an electric field.

In the organic light-emitting display panel shown in FIGS. 2 to 4, the pixel driving circuits and the driving control circuits are disposed in the display area of the base substrate, each shift register unit in the driving control circuits is divided into a plurality of sub-units, and the sub-units are disposed in the gaps between every two adjacent pixel driving circuits respectively, so that regions where the driving control circuit and the pixel driving circuit are located are not overlapped with each other. Since the top-emission type light-emitting devices in the display area of the base substrate can cover the pixel driving circuits and the driving control circuits, the area occupied by the layout space of each pixel driving circuit is reduced under a condition that the area occupied by the original layout space of the top-emission type light-emitting devices is not changed, and a bezel space occupied by the driving control circuits is released, so that all circuits in the display area are ensured to be covered by the top-emission type light-emitting devices. Therefore, by separately designing the layout space of the pixel driving circuits and the layout space of the top-emission type light-emitting devices, it is ensured that there is enough layout space in the display area for the driving control circuits and the pixel driving circuits, and the layout space for arranging the driving control circuits at the bezel can be saved, so that the organic light-emitting display panel with ultra-narrow bezel and even bezelless design can be realized.

However, since the elements of the driving control circuits are to be arranged in the pixel units of the display panel, and a certain space needs to be provided for the elements of the pixel units, positions of driving transistors in some of the pixel units may be changed, which causes the gate of the driving transistor to spatially overlap with the anode of the light-emitting device in the adjacent pixel unit, thereby generating a coupling capacitance. Since overlapping areas between gates of driving transistors in different pixel units and anodes of light-emitting devices in adjacent pixel units may be different from each other, different coupling capacitances may be generated, thereby causing a non-uniform display of the display panel.

Figure 5:
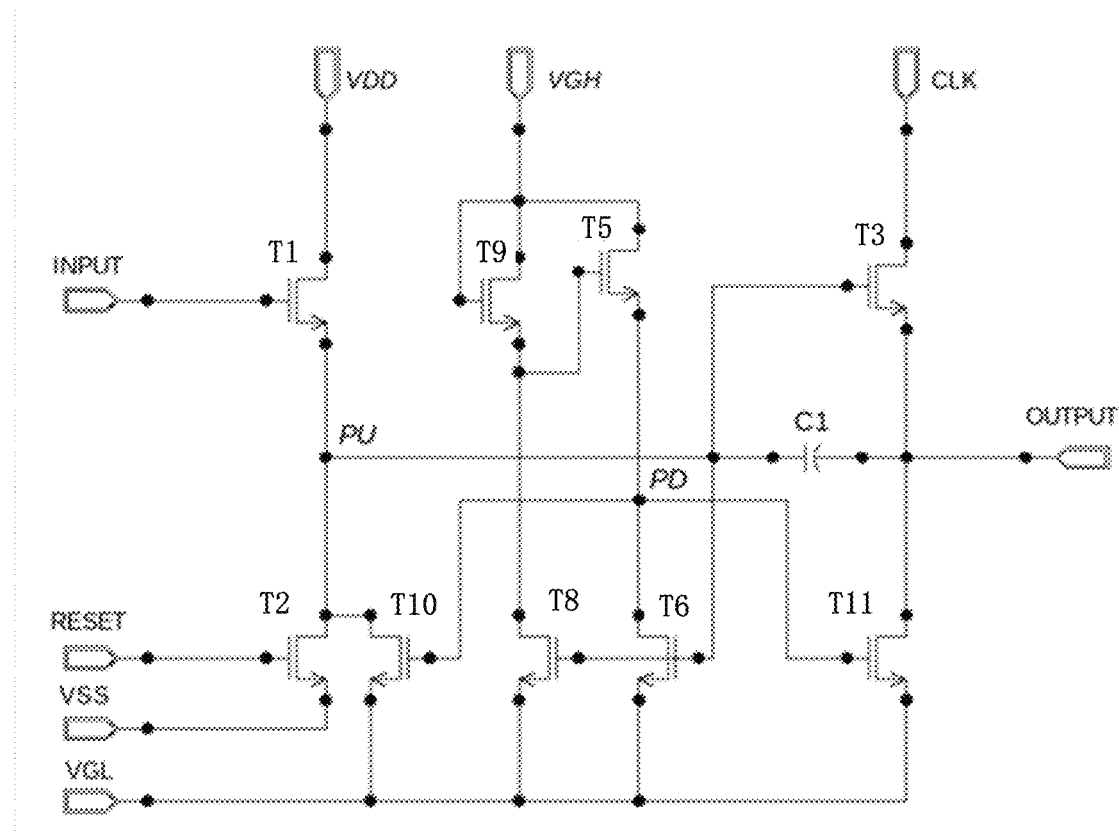
FIG. 5 is a schematic diagram of a driving control circuit in the related art.

As shown in FIG. 5, a driving control circuit in the related art is provided, and the driving control circuit includes nine thin film transistors and one storage capacitor C1. An output terminal of each driving control circuit is coupled to a gate line, and therefore, in order to provide the driving control circuits in the pixel units, it is necessary to distribute the nine thin film transistors and the storage capacitor C1 of each driving control circuit in the pixel units. In this case, it is necessary to adjust positions of transistors (the switching transistor T1 and the driving transistor T2) in the pixel circuits of each row of pixel units, which may cause the driving transistor T2 and the anode 2 of the light-emitting device D1 in adjacent pixel units overlap, thereby generating a coupling capacitance. Further, overlapping areas between driving transistors T2 and anodes 2 of light-emitting devices D1 at different positions may be different, and thus, magnitudes of coupling capacitances accordingly generated may be different. Therefore, driving currents in different pixel units are affected differently, and thus the display of the display panel is not uniform.

In order to solve the above technical problem, a shielding layer is disposed in the array substrate of the embodiment of the present disclosure, the shielding layer being disposed at least between overlapping areas of the gate electrode of the driving transistor and the first electrode of the light-emitting device. The following specific structure of the array substrate is provided for illustration. In the following embodiments, the light-emitting device D1 is an OLED device, the first electrode of the light-emitting device D1 is the anode 2, and the second electrode of the light-emitting device D1 is the cathode.

Figure 6:
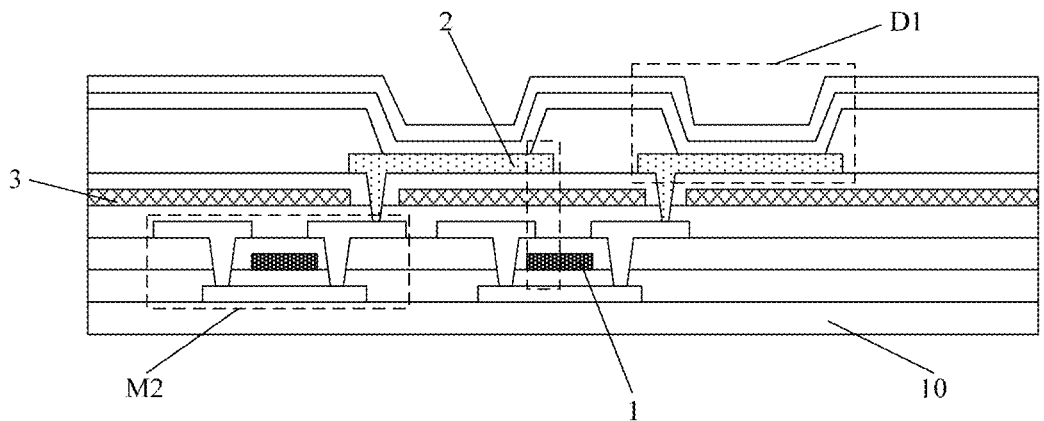
FIG. 6 is a schematic structural diagram of an array substrate according to an embodiment of the present disclosure.
Figure 7:
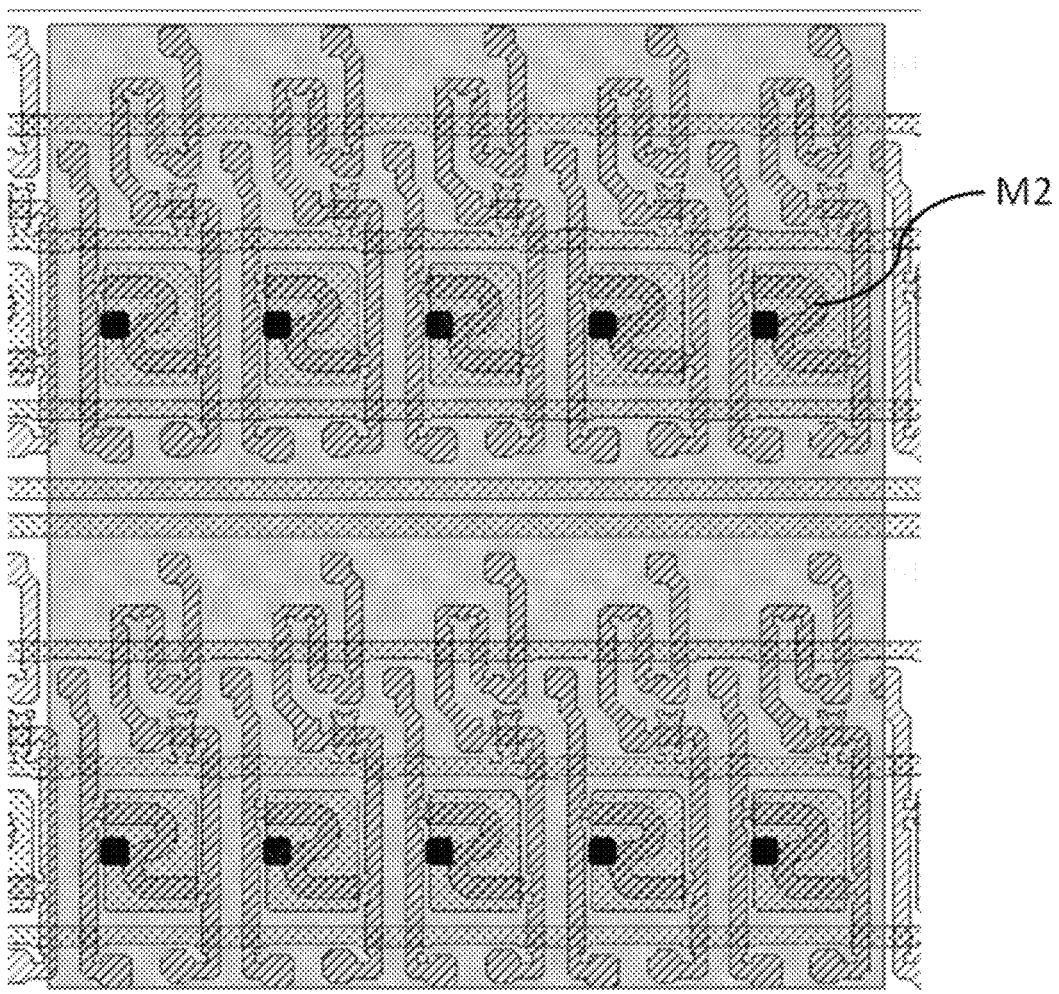
FIG. 7 is a top view illustrating a layout design of a shielding layer and a driving transistor in the array substrate of FIG. 6.

As shown in FIG. 6, an embodiment of the present disclosure provides an array substrate including: a base substrate and a plurality of pixel units positioned on the base substrate. Each pixel unit includes at least a driving transistor M2 and a light-emitting device D1, where an orthographic projection of at least a gate 1 of the driving transistor M2 and an orthographic projection of a first electrode of the light-emitting device D1 on the base substrate at least partially overlap. Particularly, a shielding layer 3 of a planar structure is disposed between a layer where the gate 1 of the driving transistor M2 in each pixel unit is located and a layer where an anode 2 of the light-emitting device D1 is located, and an orthogonal projection of the shielding layer 3 on the base substrate covers the orthogonal projection of the gate 1 of each driving transistor M2 and the first electrode of the light-emitting device D1 on the base substrate, as shown in FIG. 7. The shielding layer 3 is configured for shielding a coupling capacitance between the gate 1 of the driving transistor M2 and the first electrode of the light-emitting device D1, orthographic projections of which on the base substrate are at least partially overlapped.

The driving transistor may be a thin film transistor or a field effect transistor or any other switching device with the same characteristics, herein, description is made by taking the thin film transistor as an example, for example, an active layer (channel region) of the driving transistor is made of a semiconductor material, such as polysilicon (e.g., low temperature polysilicon or high temperature polysilicon), amorphous silicon, indium gallium tin oxide (IGZO), and the like, and a gate, a source, a drain, and the like are made of a metal material, such as aluminum metal or aluminum alloy.

For example, the shielding layer may include a conductive material, which may include, but is not limited to, titanium, a titanium alloy, aluminum, an aluminum alloy, copper, a copper alloy, or any other suitable composite material, which is not limited in the embodiments of the present disclosure.

FIG. 7 is a top view illustrating a layout design of a shielding layer and a driving transistor in the array substrate of FIG. 6. In the embodiment of FIG. 7, the shielding layer is indicated by a gray-shaded portion, and the driving transistor M2 is indicated by a hatched portion filled with oblique lines of an inverted S shape. As shown in FIG. 7, the shielding layer may be located above the layer where the driving transistor is located and cover the driving transistor entirely, i.e., an orthographic projection of the shielding layer on the base substrate may completely overlap with the orthographic projection of the gate of the driving transistor on the base substrate.

Here, it should be understood that although the shielding layer 3 according to the embodiment of the present disclosure is a planar electrode, in order to avoid the anode 2 of the light-emitting device D1 being electrically coupled to the shielding layer 3 when being coupled to the drain of the driving transistor M2, the shielding layer 3 is hollowed out at a position where the anode 2 of the light-emitting device D1 is coupled to the drain of the driving transistor M2.

Since the shielding layer 3 is disposed in the array substrate according to the embodiment of the present disclosure, the shielding layer 3 is disposed between the layer where the gate 1 of the driving transistor M2 is located and the layer where the anode 2 of the light-emitting device D1 is located, even if there is an overlap between the orthographic projection of the gate 1 of the driving transistor M2 of a certain pixel unit on the base substrate and the orthographic projection of the anode 2 of the light-emitting device D1 in another pixel unit adjacent to the certain pixel unit on the base substrate, the shielding layer 3 can shield the coupling capacitance generated therebetween. Therefore, the problem of display non-uniformity due to the presence of the coupling capacitance can be avoided.

It should be noted here that, in the present embodiment, a coupling capacitance may be generated between the shielding layer 3 and the gate 1 of each driving transistor M2, the first electrode of each light-emitting device D1. Since the shielding layer 3 is a planar structure and the orthographic projection thereof on the base substrate covers the orthographic projections of the gate 1 of each driving transistor M2 and the first electrode of each light-emitting device D1 on the base substrate, overlapping areas between the shielding layer 3 and the gates 1 of driving transistors M2 in the pixel units are the same, and overlapping areas between the shielding layer and first electrodes of light-emitting devices D1 are also the same. Therefore, the coupling capacitance generated is constant for all the pixel units, and thus the display uniformity of the display panel is not affected.

In an embodiment of the present disclosure, the source of the driving transistor M2 in each pixel unit is coupled to a power supply voltage terminal VDD (not shown). In the embodiment of the present disclosure, the shielding layer includes a conductive material, and a shielding electrode 31 of the shielding layer is coupled to the power supply voltage terminal VDD in the layer where the source and the drain of the driving transistor M2 are located through a via hole, so that a power supply voltage signal provided by the power supply voltage terminal VDD can be used as a shielding signal of the shielding electrode 31. Therefore, the shielding layer 3 and the gate 1 of the driving transistor M2 may generate a coupling capacitance, and the generated coupling capacitance may further be used as the storage capacitor C1 in the pixel unit, so as to improve the performance of the array substrate.

In the embodiment of the present disclosure, the driving transistor M2 may be a top gate type thin film transistor, and may also be a bottom gate type thin film transistor. FIG. 6 illustrates a top gate type thin film transistor as an example, and in such case, each driving transistor M2 includes an active layer, a gate insulating layer, a gate 1, an interlayer insulating layer, a source, and a drain sequentially arranged in a direction away from the base substrate. The shielding layer 3 in the embodiment of the present disclosure is located on a side of the layer where the source and the drain are located away from the base substrate. It should be understood that the shielding layer 3 and the source and the drain are made of conductive materials, and therefore, in order to prevent the shielding layer 3 and the source and the drain from being electrically coupled, an insulating layer is provided between the layer where the source and the drain are located and the layer where the shielding electrode 31 is located. In order to prevent the coupling capacitance generated by the conductive materials between the layer where the shielding electrode 31 is located and the layer where the source and the drain are located from affecting the display effect, a thickness of the insulating layer between the layer where the source and the drain are located and the layer where the shielding electrode 31 is located is designed to be larger than 1 μm, preferably ranging from 1 μm to 3 μm, so that the coupling capacitance generated between the layer where the source and the drain are located and the layer where the shielding electrode 31 is located is maintained at a low level.

The material forming the shielding layer 3 in the embodiment of the present disclosure includes a metal material. Certainly, the shielding electrode 31 according to the embodiment of the present disclosure may be formed of any other conductive material, which will not be illustrated one by one.

Figure 8:
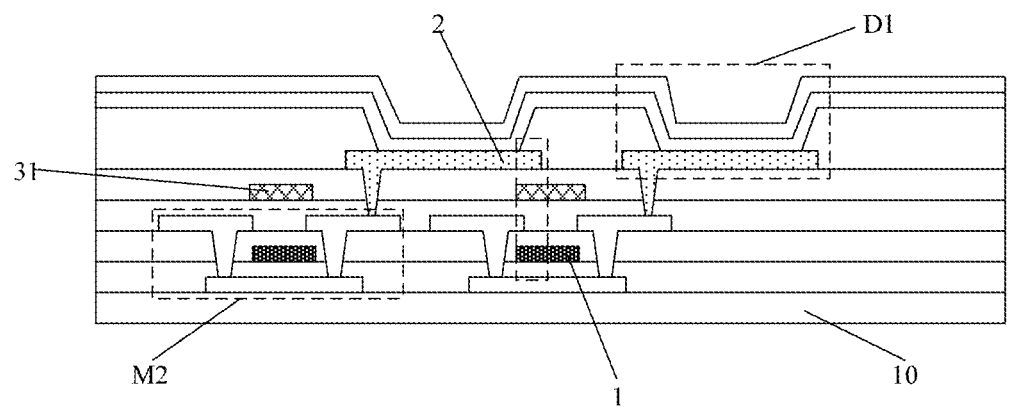
FIG. 8 is a schematic structural diagram of an array substrate according to an embodiment of the present disclosure.
Figure 9:
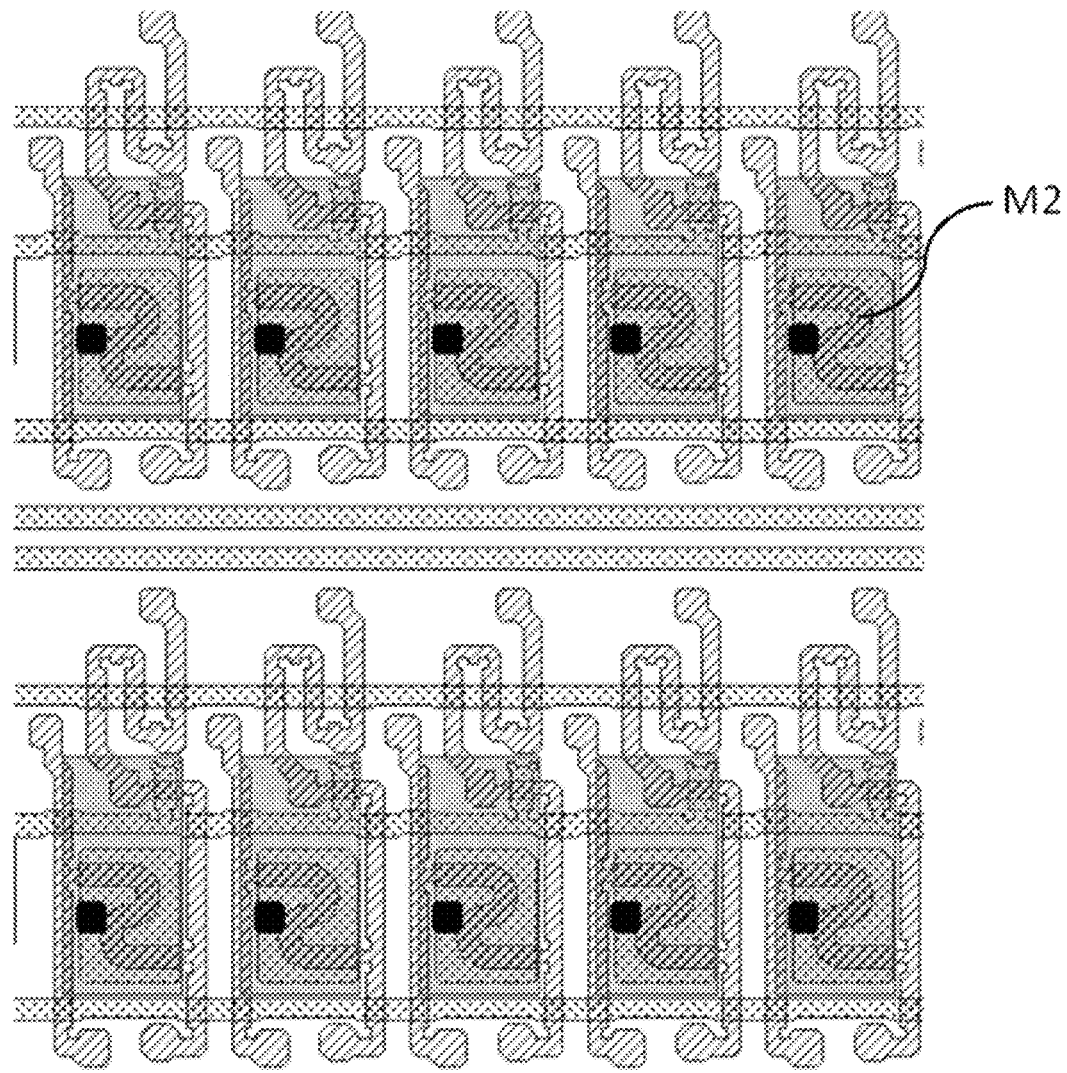
FIG. 9 is a top view illustrating a layout design of a shielding layer and a driving transistor in the array substrate of FIG. 8.

As shown in FIGS. 8 and 9, an embodiment of the present disclosure provides an array substrate having substantially the same structure as the array substrate described above except for the structure of the shielding layer 3. As shown in FIGS. 8 and 9, the shielding layer 3 in the present embodiment includes a plurality of shielding electrodes 31, the shielding electrode 31 are disposed in one-to-one correspondence with gates 1 of driving transistors M2 in the pixel units, and the orthographic projection of each shielding electrode 31 on the base substrate overlaps the orthographic projection of the gate 1 of the driving transistor M2 corresponding thereto on the base substrate.

FIG. 9 is a top view illustrating a layout design of the shielding layer and the driving transistor in the array substrate of FIG. 8. In the embodiment of FIG. 9, the shielding layer includes a plurality of shield electrodes indicated by gray-shaded portions, and the driving transistor M2 is indicated by a hatched portion filled with oblique lines of an inverted S shape. As shown in FIG. 9, the shielding layer where the shielding electrode is located may be located above the layer where the driving transistor is located, and covers all of driving transistors corresponding thereto.

Since the shielding electrodes 31 in the shielding layer 3 are disposed in one-to-one correspondence with the gates 1 of the driving transistors M2 in the array substrate of the present embodiment, each shielding electrode 31 can shield a coupling capacitance from being generated between the gate 1 of the driving transistor M2 corresponding thereto and the anode 2 of the light-emitting device D1 in the pixel unit adjacent to that the driving transistor M2 is located. Moreover, each shielding electrode 31 is disposed corresponding to only the gate 1 of the driving transistor M2, so that a generation of coupling capacitance between the shielding layer 3 and any other conductive structure (e.g., source, drain, data line, gate line) on a side of the shielding layer 3 proximal to the base substrate can be avoided, thereby ensuring capability of writing a data voltage by the data line and driving capability of the driving control circuit.

The remaining structures in the array substrate according to the embodiment of the present disclosure may be the same as those described above, and are not described again.

Figure 10:
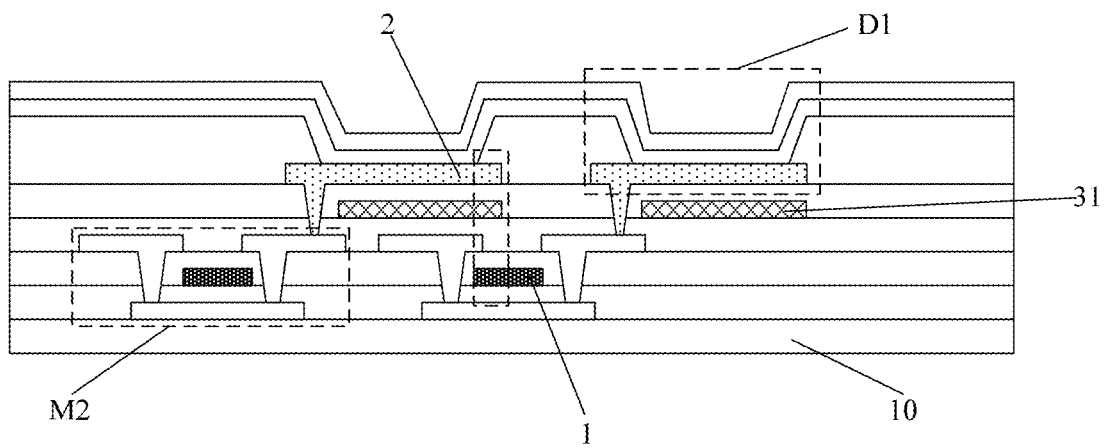
FIG. 10 is a schematic structural diagram of an array substrate according to an embodiment of the present disclosure.

As shown in FIG. 10, an embodiment of the present disclosure provides an array substrate, which has a structure substantially the same as that of the array substrate shown in FIG. 6 or FIG. 8, and a different therebetween is in the structure of the shielding layer 3, specifically, in the present embodiment, the shielding layer 3 includes a plurality of shielding electrodes 31, the shielding electrodes 31 are disposed in one-to-one correspondence with anodes 2 of light-emitting devices D1 in the pixel units, and the orthographic projection of each shielding electrode 31 on the base substrate partially overlaps with the orthographic projection of the gate 1 of the driving transistor M2 corresponding thereto on the base substrate.

In the embodiment of the present disclosure, since the shielding electrodes 31 in the shielding layer 3 are disposed in one-to-one correspondence with the anodes 2 of the light-emitting devices D1 in the array substrate, each shielding electrode 31 may shield the coupling capacitance from being generated between the gate 1 of the driving transistor M2 corresponding thereto and the anode 2 of the light-emitting device D1 in the pixel unit adjacent to that the driving transistor M2 is located. Further, each shield electrode 31 is provided corresponding to only the anode 2 of the light-emitting device D1, and therefore, it is possible to reduce a generation of coupling capacitance between the shielding layer 3 and any other conductive structure (e.g., source, drain, data line, gate line) on a side of the shielding layer 3 proximal to the base substrate, thereby ensuring capability of writing a data voltage by the data line and driving capability of the driving control circuit.

The remaining structures in the array substrate according to the embodiment of the present disclosure may be the same as those described above, and are not described herein again.

The overlapping relationship of the shielding layer and the driving transistor in the top view according to the embodiment of the present disclosure is not limited to those illustrated with reference to FIGS. 7 and 9. According to the embodiment of the present disclosure, the shielding layer may be disposed between the overlapping areas of the gate of the driving transistor and the first electrode (anode) of the light-emitting device, and the shape and the size of the shielding layer are not particularly limited.

Figure 11:
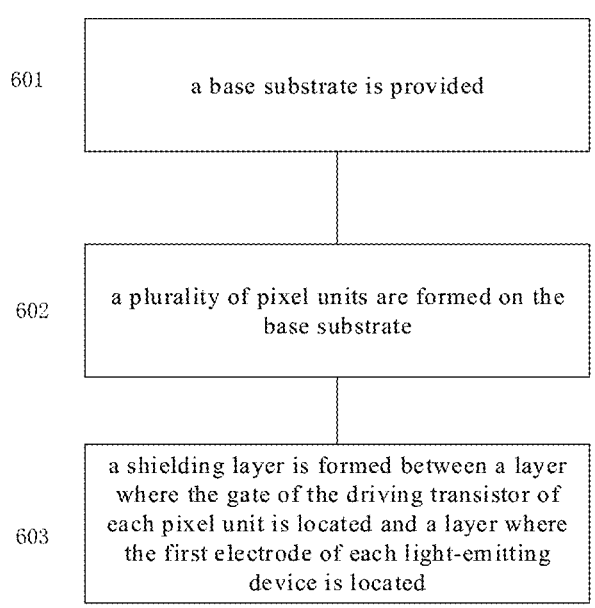
FIG. 11 is a flowchart of a manufacturing method of an array substrate according to an embodiment of the present disclosure.

FIG. 11 shows a flow chart of a manufacturing method of an array substrate according to an embodiment of the present disclosure. The structure of the array substrate according to the present embodiment of the present disclosure may be the same as the structure of the array substrate with reference to FIGS. 3 to 5, and is not described again. As shown in FIG. 11, at step 601, a base substrate is provided. At step 602, a plurality of pixel units are formed on the base substrate. At step 603, a shielding layer is formed between a layer where a gate of a driving transistor of each pixel unit is located and a layer where a first electrode of each light-emitting device is located.

According to an embodiment of the present disclosure, a display panel and a display device are provided, where the display panel includes any one of array substrates described above, and thus the display uniformity of the display panel is good.

The display device according to the embodiment of the present disclosure includes the display panel described above.

The display device may be any product or component with a display function, such as electronic paper, an OLED panel, a mobile phone, a tablet computer, a television, a display, a notebook computer, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. An array substrate, comprising: a base substrate, and a plurality of pixel units on the base substrate; each of the pixel units at least comprises a driving transistor and a light-emitting device, an orthographic projection of a first electrode of the light-emitting device of at least one of the pixel units on the base substrate overlaps an orthographic projection of a gate of the driving transistor of a pixel unit adjacent to the at least one of the pixel units on the base substrate, wherein, the array substrate further comprises: a first shielding layer located between a layer where the first electrode of the light-emitting device of the at least one of the pixel units is located and a layer where the gate of the driving transistor in the pixel unit adjacent to the at least one of the pixel units is located, an orthographic projection of the first shielding layer on the base substrate overlaps the orthographic projection of the first electrode of the light-emitting device of the at least one of the pixel units on the base substrate and the orthographic projection of the gate of the driving transistor of the pixel unit adjacent to the at least one of the pixel units on the base substrate.

2. The array substrate of claim 1, wherein the first electrode of the light-emitting device is an anode of the light-emitting device.

3. The array substrate of claim 1, wherein an orthographic projection of the gate of each of at least a portion of driving transistors on the base substrate and an orthographic projection of the first electrode of the light-emitting device corresponding thereto at least partially overlap; the first shielding layer is further located between a layer where the gate of each of the at least portion of driving transistors is located and a layer where the first electrode of each of the light-emitting devices corresponding thereto; and an orthographic projection of the first shielding layer on the base substrate at least partially overlaps with an orthographic projection of the gate of each of the at least portion of the driving transistors on the base substrate and an orthographic projection of the first electrode of the light-emitting device corresponding to the each driving transistor on the base substrate.

4. The array substrate of claim 3, wherein the first shielding layer comprises a conductive material, and wherein the first shielding layer is coupled to a power supply voltage terminal in a layer where a source and a drain of the driving transistor are located through a via hole.

5. The array substrate of claim 1, wherein the first shielding layer is in a planar structure, and an orthographic projection of the first shielding layer on the base substrate covers an orthographic projection of the gate of each driving transistor on the base substrate and an orthographic projection of the first electrode of each light-emitting device on the base substrate.

6. The array substrate of claim 1, wherein the first shielding layer comprises a plurality of shielding electrodes, wherein,
the shielding electrodes are in one-to-one correspondence with gates of driving transistors in the pixel units.

7. The array substrate of claim 6, wherein each of the shielding electrodes comprises a conductive material, and wherein the first shielding layer is coupled to a power supply voltage terminal in a layer where a source and a drain of the driving transistor are located through a via hole.

8. The array substrate of claim 7, wherein the conductive material comprises titanium, titanium alloy, aluminum alloy, copper alloy.

9. The array substrate of claim 1, wherein the first shielding layer comprises a plurality of shielding electrodes, wherein,
the shielding electrodes are in one-to-one correspondence with first electrodes of light-emitting devices in the pixel units.

10. The array substrate of claim 1, wherein the first shielding layer is located on a side of a layer where a source and a drain of the driving transistor are located away from the base substrate.

11. The array substrate of claim 1, wherein an insulating layer is disposed between a layer where a source and a drain of the driving transistor are located and a layer where the first shielding layer is located, and a thickness of the insulating layer is greater than 1 μm and less than 3 μm.

12. The array substrate of claim 1, further comprising a display area, and a driving control circuit on the base substrate, and wherein,
the driving control circuit and the pixel units are located in the display area.

13. The array substrate of claim 12, further comprising a plurality of pixel driving circuits located in the display area, wherein light-emitting devices are located in the display area of the array substrate and cover the pixel driving circuits and the driving control circuit;
the driving control circuit comprises: a plurality of shift register units cascaded, each of the shift register units is divided into a plurality of sub-units, and the sub-units are located in gaps between every two adjacent pixel driving circuits respectively; different sub-units in a same one of the shift register units are in different gaps respectively, the anode of the light-emitting device is electrically coupled to the pixel driving circuit corresponding thereto through a first connection line, and the sub-units in the same one of the shift register units are electrically coupled through a second connection line.

14. The array substrate of claim 13, wherein the sub-units in the same one of the shift register units are in a same row.

15. The array substrate of claim 14, further comprising: a plurality of power supply lines and a plurality of data lines which are arranged in a same layer and extend along a column direction; each of the power supply lines and each of the data lines are insulated from the second connection line, and an overlapping area exists between the second connection line corresponding to a same row and a portion of the power supply lines, a portion of the data lines;
the array substrate further comprises: a second shielding layer located between a layer where the second connection line is located and a layer where the data lines are located; an orthographic projection of the second shielding layer on the base substrate covers orthographic projections of overlapping areas between the power supply line, the data line and the second connection line on the base substrate.

16. A display device, comprising the array substrate of claim 1 and a cover plate.

17. A manufacturing method of an array substrate, the array substrate comprising a base substrate, and a plurality of pixel units located on the base substrate, each of the pixel units comprising a driving transistor and a light-emitting device, wherein the array substrate further comprises a shielding layer located between a layer where a gate of the driving transistor in each of the pixel units is located and a layer where a first electrode of the light-emitting device corresponding thereto is located, and wherein the manufacturing method comprises: providing the base substrate; forming the plurality of pixel units on the base substrate; an orthographic projection of a first electrode of the light-emitting device of at least one of the pixel units on the base substrate overlapping an orthographic projection of a gate of the driving transistor of a pixel unit adjacent to the at least one of the pixel units on the base substrate; forming the shielding layer between a layer where the first electrode of the light-emitting device of the at least one of the pixel units is located and a layer where the gate of the driving transistor in the pixel unit adjacent to the at least one of the pixel units is located, an orthographic projection of the shielding layer on the base substrate overlapping the orthographic projection of the first electrode of the light-emitting device of the at least one of the pixel units on the base substrate and the orthographic projection of the gate of the driving transistor of the pixel unit adjacent to the at least one of the pixel units on the base substrate.

18. The manufacturing method of claim 17, wherein an orthogonal projection of the gate of each of at least a portion of driving transistors on the base substrate and an orthogonal projection of the first electrode of the light-emitting device corresponding thereto on the base substrate at least partially overlap, and wherein the forming the shielding layer between a layer where the first electrode of the light-emitting device of the at least one of the pixel units is located and a layer where the gate of the driving transistor in the pixel unit adjacent to the at least one of the pixel units is located further comprises: forming the shielding layer at least between overlapping areas of the gate of the driving transistor and the first electrode of the light-emitting device, wherein an orthographic projection of the shielding layer on the base substrate at least partially overlaps with an orthographic projection of the gate of each of the at least portion of the driving transistors on the base substrate and an orthographic projection of the first electrode of the light-emitting device corresponding to the each of the at least portion of the driving transistors on the base substrate.

19. The manufacturing method of claim 17, wherein the shielding layer is formed in a planar structure, and an orthogonal projection of the shielding layer on the base substrate covers orthogonal projections of the gate of the driving transistor and the first electrode of the light-emitting device on the base substrate.

20. The manufacturing method of claim 17, wherein the shielding layer is formed to comprise a plurality of shielding electrodes formed in one-to-one correspondence with gates of driving transistors in the pixel units.

21. The manufacturing method of claim 17, wherein the shielding layer is formed to include a plurality of shielding electrodes formed in one-to-one correspondence with first electrodes of light-emitting devices in the pixel units.

22. The manufacturing method of claim 20, wherein the shielding electrode is made of a conductive material, and the array substrate further comprises a power supply voltage terminal, wherein the shielding electrode is formed to be coupled to the power supply voltage terminal.

23. The manufacturing method of claim 17, wherein the shielding layer is formed on a side of the layer where a source and a drain of the driving transistor are located away from the base substrate.

24. The manufacturing method of claim 17, wherein the array substrate comprises a display area, the manufacturing method further comprising forming driving control circuits on the base substrate, wherein the driving control circuits and the plurality of pixel units are located in the display area,
wherein the manufacturing method further comprises:
forming a plurality of pixel driving circuits in the display area, wherein light-emitting devices are located in the display area of the array substrate and cover the pixel driving circuits and the driving control circuits;

wherein the driving control circuit comprises: a plurality of shift register units cascaded; each of the shift register units is divided into a plurality of sub-units, and each of the sub-units is positioned in a gap between two adjacent pixel driving circuits; the sub-units in a same one of the shift register units are located in different gaps respectively, the anode of the light-emitting device is electrically coupled to the pixel driving circuit corresponding thereto through a first connection line, and the sub-units in the same one of the shift register units are electrically coupled through a second connection line.

25. The manufacturing method of claim 24, further comprising: forming all the sub-units in the same one of the shift register units in a same row.

26. The manufacturing method of claim 24, wherein the array substrate further comprises: a plurality of power supply lines and a plurality of data lines which are arranged in a same layer and extend along a column direction; the power supply lines and the data lines are insulated from the second connection line, an overlapping area exists between the second connection line corresponding to a same row and a portion of the power supply lines, a portion of the data lines, and the manufacturing method further comprises:

forming a second shielding layer between a layer where the second connection line is located and a layer where the data lines are located, wherein an orthographic projection of the second shielding layer on the base substrate covers orthographic projections of overlapping areas of the power supply lines and the second connection line on the base substrate, and orthographic projections of overlapping areas of the data lines and the second connection line on the base substrate.

* * * * *